(12) United States Patent
Satoh

(10) Patent No.: US 8,071,964 B2
(45) Date of Patent: Dec. 6, 2011

(54) SYSTEM AND METHOD OF PERFORMING UNIFORM DOSE IMPLANTATION UNDER ADVERSE CONDITIONS

(75) Inventor: Shu Satoh, Byfield, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 248 days.

(21) Appl. No.: 12/431,081

(22) Filed: Apr. 28, 2009

(65) Prior Publication Data

US 2009/0272918 A1 Nov. 5, 2009

Related U.S. Application Data

(60) Provisional application No. 61/049,717, filed on May 1, 2008.

(51) Int. Cl.
*H01J 37/317* (2006.01)
*H01J 37/256* (2006.01)

(52) U.S. Cl. ............ 250/492.21; 250/492.2; 250/281; 250/282; 250/396 R; 250/397; 427/523

(58) Field of Classification Search ............ 250/492.21, 250/492.2, 396 R, 397, 281, 282
See application file for complete search history.

(56) References Cited

U.S. PATENT DOCUMENTS

| | | | |
|---|---|---|---|
| 4,367,411 A | 1/1983 | Hanley et al. | |
| 4,539,217 A | 9/1985 | Farley | |
| 4,587,433 A * | 5/1986 | Farley | 250/492.2 |
| 4,847,504 A * | 7/1989 | Aitken | 250/492.2 |
| 4,851,693 A | 7/1989 | Fisher | |
| 5,834,786 A * | 11/1998 | White et al. | 250/492.21 |
| 6,323,497 B1 | 11/2001 | Walther | |
| 7,589,333 B2 * | 9/2009 | Graf et al. | 250/492.21 |
| 2004/0047561 A1 | 3/2004 | Tuda | |
| 2004/0149983 A1 | 8/2004 | Lee et al. | |
| 2006/0057303 A1* | 3/2006 | Agarwal et al. | 427/523 |
| 2009/0218315 A1 | 9/2009 | Shannon | |
| 2009/0272918 A1 | 11/2009 | Satoh | |

OTHER PUBLICATIONS

U.S. Appl. No. 12/717,536, filed Mar. 4, 2010.
Notice of Allowance Dated Sep. 20, 2011 for U.S. Appl. No. 12/717,536. 22 Pages.

* cited by examiner

*Primary Examiner* — Nikita Wells
(74) *Attorney, Agent, or Firm* — Eschweiler & Associates, LLC

(57) ABSTRACT

An ion implantation system and associated method includes a scanner configured to scan a pencil shaped ion beam into a ribbon shaped ion beam, and a beam bending element configured to receive the ribbon shaped ion beam having a first direction, and bend the ribbon shaped ion beam to travel in a second direction. The system further includes an end station positioned downstream of the beam bending element, wherein the end station is configured to receive the ribbon shaped ion beam traveling in the second direction, and secure a workpiece for implantation thereof. In addition, the system includes a beam current measurement system located at an exit opening of the beam bending element that is configured to measure a beam current of the ribbon shaped ion beam at the exit opening of the beam bending element.

16 Claims, 5 Drawing Sheets

SYSTEM AND METHOD OF PERFORMING UNIFORM DOSE IMPLANTATION UNDER ADVERSE CONDITIONS

RELATED APPLICATION

This application claims priority to and the benefit of Ser. No. 61/049,717 filed May 1, 2008, which is entitled "SYSTEM AND METHOD OF PERFORMING UNIFORM DOSE IMPLANTATION UNDER ADVERSE CONDITIONS", the entirety of which is hereby incorporated by reference as if fully set forth herein.

FIELD OF THE INVENTION

The present invention relates generally to ion implantation systems, and more particularly to a system and method for performing dosimetry control under adverse conditions, for example, heavy outgassing during implants on photoresist coated workpieces/wafers.

BACKGROUND OF THE INVENTION

In the manufacture of semiconductor devices, ion implantation is used to dope semiconductors with impurities. Ion beam implanters are used to treat silicon wafers with an ion beam, in order to produce n or p type extrinsic material doping or to form passivation layers during fabrication of an integrated circuit. When used for doping semiconductors, the ion beam implanter injects a selected ion species to produce the desired extrinsic material. Implanting ions generated from source materials such as antimony, arsenic or phosphorus results in "n type" extrinsic material wafers, whereas if "p type" extrinsic material wafers are desired, ions generated with source materials such as boron, gallium or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway is typically evacuated to reduce the probability of ions being deflected from the predetermined beam path as a result of collisions with gas molecules.

Dosimetry is the measurement of ions implanted in a wafer or workpiece. In controlling the dosage of implanted ions, closed loop feedback control systems typically are utilized in order to dynamically adjust the implantation to achieve uniformity in the implanted workpiece. Such control systems utilize real-time current monitoring to control the workpiece slow scan velocity. A Faraday disk or Faraday cup periodically measures the beam current and adjusts the slow scan speed to ensure constant dosing. Frequent measurement allows the dose control system to respond quickly to changes in beam current. The Faraday cup is located close to the workpieces, making it sensitive to the beam current actually dosing the workpieces.

The purpose of the dosimetry system is to know the amount of dopant being delivered to a workpiece and, in ion implantation applications, it is done by measuring electrical current (i.e., the beam current). If all the dopant particles carry the same charge value q, the number of dopant particles "n" delivered to a wafer per second is given simply by the measured electrical current (beam current) "I" (amps) as follows:

$$n = i/(qe),$$

where e is the value of electron charge, which is about $1.6 \times 10^{-19}$ Coulomb. Normally all the ions carry a same charge value and the charge value, q, is a single integer. If the ion beam consists of ions of different charge states (including neutrals for which the charge value is zero), q is a weighted average of the charge values with its charge state distribution and the simple relationship provided above no longer holds. Since the charge state distribution of an ion beam can change (by charge exchange reactions which will be described in greater detail infra) and is very difficult to measure, especially since it may contain large portion of neutral atoms (which can not measured with any electrical methods), substantial effort is paid to keep the charge value in the ion beam at the initially intended single value.

Some processes, however, act to cause ions to change their initial charge value, and one such process is called a charge exchange reaction. When a high speed ion comes in close proximity to another molecule or atom, the ion may pick up an electron from the molecule or atom (i.e., an electron "picking up" reaction), or may loose an electron to the molecule or atom (i.e., a charge stripping reaction). The former reaction reduces the value of ion charge by 1, for example, a singly charged ion becomes a neutral, that is, an electrically neutral atom. The latter increases the value of ion charge by one, e.g., a singly charged ion becomes a doubly charged ion.

In ion implantation systems, effort is expended to prevent the frequent occurrence of these charge exchange reactions by maintaining the entire path of the ions at a high degree of vacuum, typically at $<1 \times 10^{-6}$ torr. However, in many ion implantation applications dealing with semiconductor manufacturing, a workpiece, a semiconductor wafer, is partially covered with a thin organic film called photoresist to mask certain areas and thereby selectively dope only a desired portion of the wafer. When high speed ions hit the photoresist layer on the wafer, some of molecular bonds in the organic film are broken and some of the released atoms form gas, most likely hydrogen gas. The amount of released gas can be substantial and may operation to degrade the vacuum level in the ion beam path, and in extreme cases almost 50% of the ions in the ion beam experience charge exchange reactions.

For each charge exchange reaction, there is a value called reaction cross section which describes a probability of the occurrence of the reaction under a unit density of residual atoms. The reaction cross section is given in the dimension of area (as its name suggests, usually in cm$^2$), and its value changes in wide range by ion speed, ion charge value, ion mass and a residual gas atom. If one denotes the value of charge exchange cross section, $\sigma_{xy}$, for a reaction to change ion charge x to y, the fraction of the ion beam that has changed charge value from the original charge x to a final charge value y after passage through a gas layer is given as;

$$f_y \approx 3.3 \times 10^{16} p * L * \sigma_{xy},$$

where p is a vacuum pressure in torr, and L is the length of the passage in cm. The fraction of the original charge state x is given as:

$$f_x = 1 - (f_{x-1} + f_{x-2} + \dots) - (f_{x+1} + f_{x+2} + f_{x+3} + \dots)$$

and the second term on the right is for electron "pick up" reactions, while the third term is for stripping reactions.

Using the fraction of final charge, fy, one can calculate the average charge value after the passage of the gas layer as:

$$q_{av} = f_x * x + \{f_{x-1} * (x-1) + f_{x-2} * (x-2) + \ldots\} + \{f_{x+1} * (x+1) + f_{x+2} * (x+2) + \ldots\}.$$

For practical purposes, one can limit the final charge states to values between 0 and 3. For example, for a starting ion charge of +1 (x=1), $$q_{av} \approx (1-(f_0+f_2+f_3)) + \{f_0 * 0 + f_2 * 2 + f_3 * 3\}.$$

Further, when the ion beam energy is low enough for all the stripping reactions to be negligibly small ($\sigma_{12} \approx \sigma_{13} \approx 0$) and the only charge exchange reaction is an electron picking-up, the formula becomes much simpler:

$$q_{av} \approx 1 - f_0.$$

In this simplified example case, the formula for number "n" of dopant atoms is given by the measured beam current i:

$$n = i / ((1-f_0) * e),$$

i.e., number of dopant atom goes up by $1/(1-f_0)$ for a same beam current.

The above example shows that to get actual number of dopant from a measured electrical beam current, we have to know $f_0$, the fraction of charge exchanged ions, which is very difficult to know.

FIG. 1 shows a prior art ion implantation system, that employs pressure compensation for dosimetry control. An ion beam 9 exits an ion source 2, and is mass analyzed by a mass analyzer 3, and then directed toward an end station 5 that, in one example, is a batch system containing a plurality of workpieces 6 thereon. A Faraday cup 7 measures the ion beam reaching the wafers immediately behind the end station through a slit 8 on the disc. Since number of dopant particles arriving at the disc has to be calculated from a measured beam current at the Faraday 7 with the above formula that contains a factor $f_0$ which in turn depends on the pressure in the beam path, this method uses an empirical correction to the measured beam current with an instantaneous pressure measured with an ion gauge 16 placed in a process chamber 15.

In this method, a proportionality factor between a beam current and number of atoms on wafer is empirically determined for each implantation condition, according to each implantation "recipe", that is: ion beam energy, mass, charge value, beam current and total dose level of the implantation. One shortcoming of this p-comp method is that the empirical factor has to be determined on each implant recipe prior to actual implantation and effort has to be made so that the factor stays unchanged for long time. Another challenge to this prior art solution is that the assumed functional approximation between a pressure and dose tends to break down at higher pressures. Because of this challenge, some users limit beam current to keep the approximation valid although it affects the productivity adversely.

Accordingly, it is desirable to have an improved system and method for performing dosimetry control.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

An ion implantation system is provided, and comprises a scanner configured to scan a pencil shaped ion beam into a ribbon shaped ion beam, and a beam bending element configured to receive the ribbon shaped ion beam having a first direction, and bend the ribbon shaped ion beam to travel in a second direction. The system further comprises an end station positioned downstream of the beam bending element, wherein the end station is configured to receive the ribbon shaped ion beam traveling in the second direction, and is further configured to secure a workpiece for implantation thereof. Still further, the system comprises a beam current measurement system located at an exit opening of the beam bending element that is configured to measure a beam current of the ribbon shaped ion beam at the exit opening of the beam bending element.

According to another aspect of the invention, the system comprises a dosimetry control system configured to receive a measured beam current from the beam current measurement system and control a scanning of the workpiece on the end station in a direction that is generally orthogonal to a width of the ion beam.

In one aspect of the invention, the beam current measurement system comprises a Faraday cup having one or more slits at an entrance thereof, wherein the one or more slits operate to limit an acceptance of ions of the ribbon shaped ion beam to a predetermined angle range about an axis of the Faraday cup.

In another aspect of the invention, the system further comprises a gate operably associated with the Faraday cup that is configured to selectively prevent the Faraday cup from registering a beam current. In one embodiment the gate is configured to selectively prevent the Faraday cup from registering the beam current as a function of a scanning voltage of the scanner. In another embodiment, the gate is configured to allow the Faraday cup to register the beam current when the scanned ion beam sweeps across the one or more slits at the entrance thereof, and prevents the Faraday cup from registering the beam current otherwise.

According to another aspect of the invention, the ribbon shaped ion beam comprises edges along a width direction thereof, and the beam current measurement system comprises two Faraday cups each positioned at respective edges of the ribbon shaped ion beam at the exit opening of the beam bending element. A dosimetry control system is configured to receive and average together the measured beam currents from the two Faraday cups and control a scanning of the workpiece on the end station in a direction that is generally orthogonal to the width of the ion beam.

According to still another aspect of the invention, the end station resides in a process chamber having a vacuum pump operably associated therewith to achieve a vacuum therein. In addition, the beam bending element resides in a magnet chamber. The system also comprises a conductance limiter configured to couple together the process chamber and the magnet chamber that is further configured to reduce an influx of outgas from a workpiece on the end station into the magnet chamber.

According to another aspect of the invention, a method of performing dosimetry control in an ion implantation system comprises bending a ribbon shaped ion beam using a beam bending element, and measuring a beam current of the ribbon shaped ion beam at an exit opening of the beam bending element. The method further comprises controlling a scanning of a workpiece with respect to the ribbon shaped ion beam as a function of the measured ion beam current.

In one embodiment, measuring the beam current comprises positioning a Faraday cup at the exit opening of the beam bending element. In another embodiment, the method comprises limiting an acceptance of ions of the ribbon shaped ion beam received by the Faraday cup to a predetermined angle about an axis of the Faraday cup. In still another embodiment, the ribbon shaped ion beam comprises edges along a width direction thereof, and the method comprises measuring the beam current comprises positioning a Faraday cup at each edge of the ribbon shaped ion beam at the exit opening of the beam bending element. The measured beam currents from the Faraday cups are then averaged, and the method then comprises controlling the scanning of the workpiece as a function of the average beam current.

According to another aspect of the invention, the method comprises scanning a pencil shaped beam into the ribbon shaped ion beam prior to bending the ribbon shaped ion beam, and selectively preventing the Faraday cup from registering a beam current measurement as a function of the scanning of the pencil shaped ion beam into the ribbon shaped ion beam. In one embodiment, selectively preventing comprises allowing the Faraday cup to register the beam current when the scanned ion beam sweeps across the Faraday cup, and preventing the Faraday cup from registering the beam current otherwise.

According to another aspect of the invention, the workpiece resides on an end station within a process chamber, and the beam bending element resides in a magnet chamber. In this instance the method comprises coupling the process chamber to the magnet chamber with a conductance limiter that is configured to reduce an influx of outgas from the workpiece into the magnet chamber.

To the accomplishment of the foregoing and related ends, the invention comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
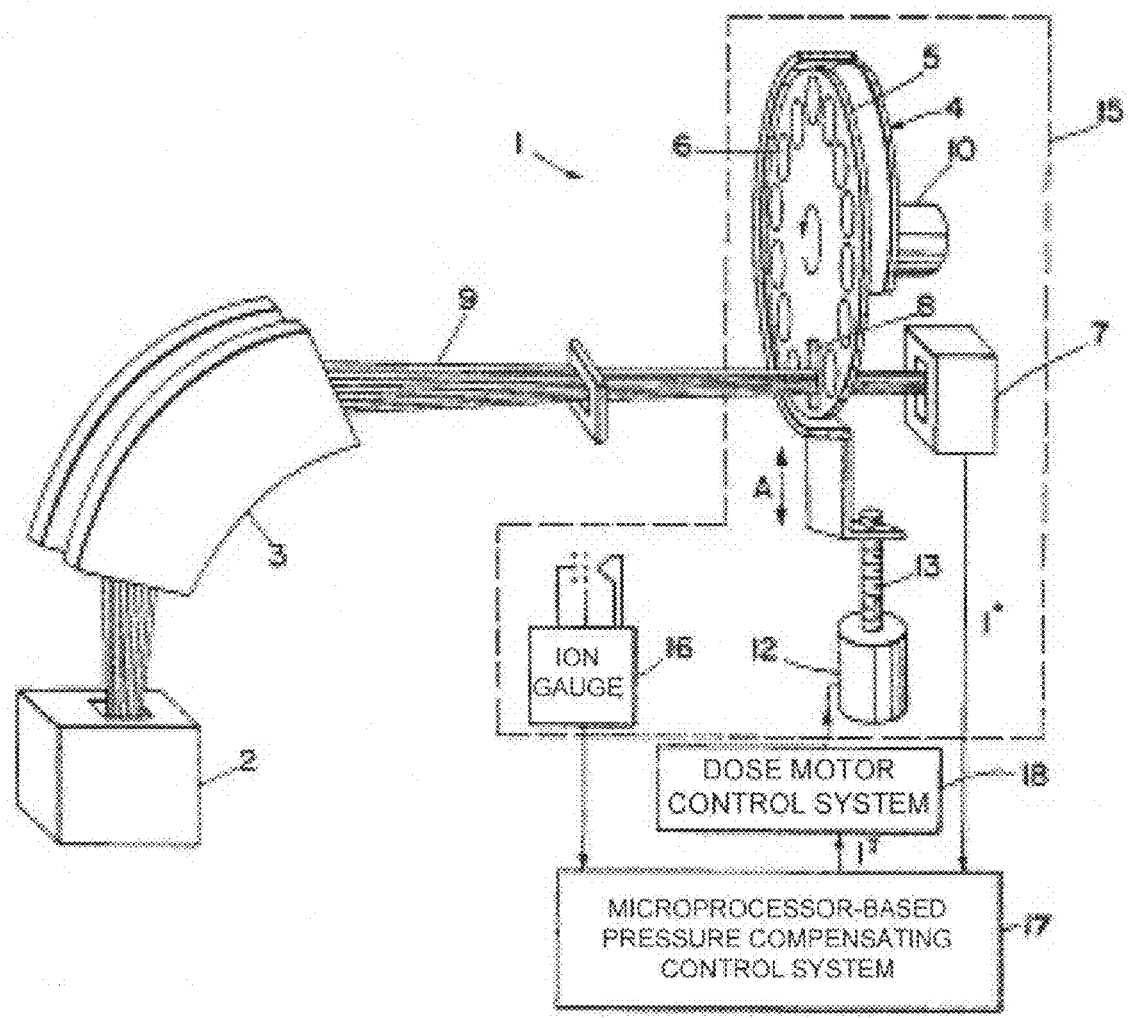
FIG. 1 is a prior art system level diagram of an ion implantation system with a dosimetry control system based on pressure compensation.

The present invention will now be described with reference to the drawings wherein like reference numerals are used to refer to like elements throughout. The invention provides a system and method for determining a pressure compensation factor for use in an ion implanter.

As stated above, charge exchange reactions between an ion beam and residual gas can add or subtract electrons from the ions, changing the various ions' charge state from the value stated in the recipe. When the charge exchange reaction is neutralization, a portion of the incident ion flux is neutralized. The result is a reduction in the detected electrical current while the actual particle current or flux (including neutrals) remains unchanged. When the charge exchange reaction is electron stripping, a portion of the ion flux loses electrons, and the result is an increase in the electrical current while the particle current remains the same.

For typical recipes where charge exchange is an issue, the beam undergoes more neutralization than stripping. As a result, the beam current measured by the Faraday cup decreases whenever the end station pressure increases. Ions in the beam are neutralized, but they are not deflected or stopped by the residual gas. The dose rate, dopant atoms per area per time, is unchanged by charge exchange after the final beam bending element in the beamline. Implanted neutrals contribute to the dose received by the workpiece, but are not measured by the Faraday cup, and thus are not properly accounted for in the dosimetry control. As a result, the workpiece can be overdosed. Consequently, the inventor of the present invention has appreciated that there is a need for improvement in dosimetry control.

The inventor of the present invention appreciated that a significant problem in prior art dosimetry control systems was that the Faraday cup used to measure beam current was very close to the implanted workpiece, and substantially remote from the last beam bending element in the ion implantation beamline. The present invention overcomes various shortcomings associated with the prior art by moving a beam measurement system such as a Faraday cup to an exit opening of the last beam bending element in the beamline, such as an angle correction magnet or angular energy filter. Consequently, the beam current measured at the beam measurement system corresponds substantially with the actual ion particle flux at the workpiece surface. Various advantageous features will be more fully appreciated in accordance with the discussion below.

Figure 2:
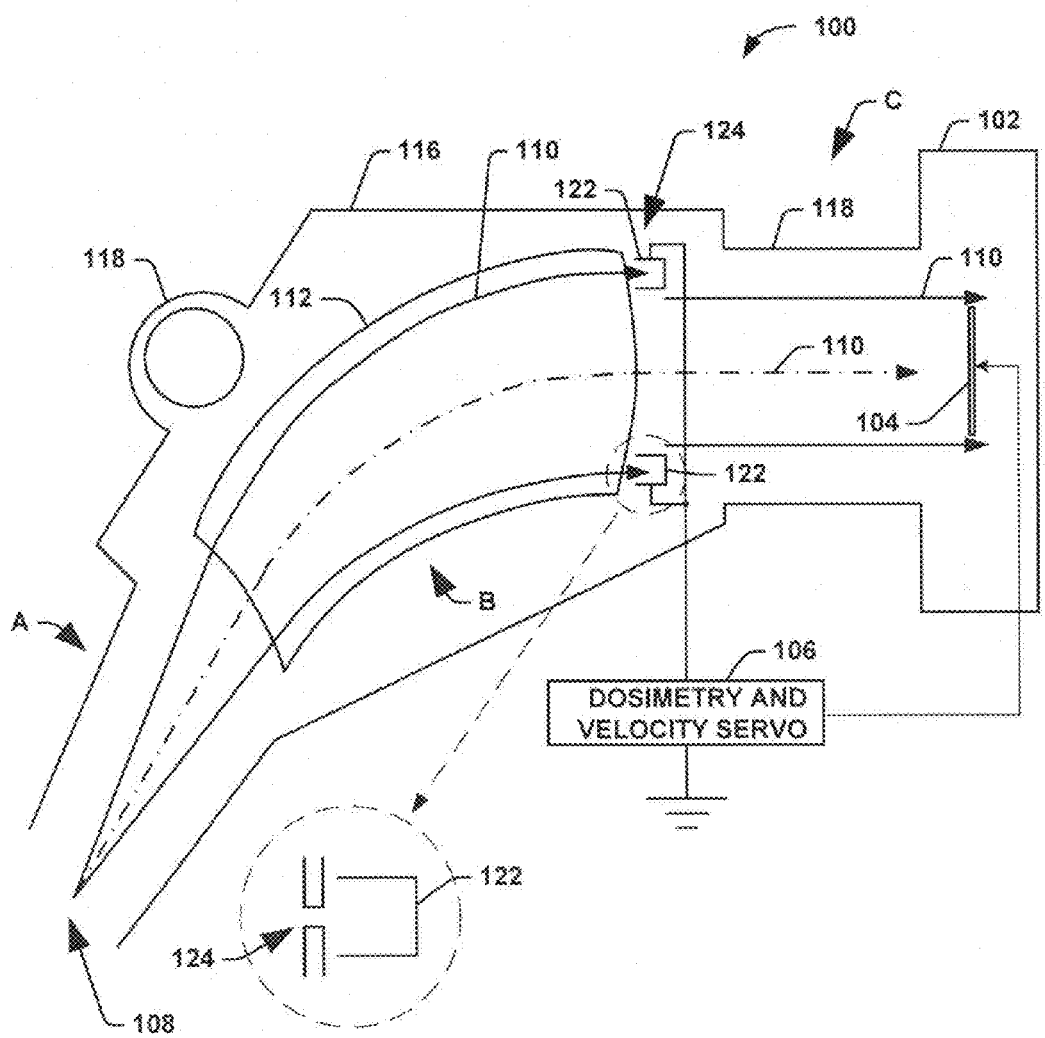
FIG. 2 is a portion of an ion implantation system according to at least one aspect of the present invention.

FIG. 2 illustrates a portion of an ion implantation system beamline 100 in accordance with one aspect of the invention. A process chamber 102 contains a workpiece, or semiconductor wafer 104, which is mechanically moved up and down (i.e., into or out of the page in the x-direction) by a dosimetry control system 106, such as a velocity-controlled servo motor system in one embodiment. The velocity of the wafer motion is controlled so that the doping density remains constant even if the intensity of the beam impinging the wafer varies for some reason.

Still referring to FIG. 2, the illustrated portion 100 comprises, in one embodiment, a last half portion of a commonly used ion implanter architecture, usually called as hybrid scan single wafer implanter. In this architecture, the ion beam is generated and mass analyzed as a pencil shaped beam 108, and is subsequently scanned, either electrostatically or magnetically to form a wide ribbon shaped beam 112. A workpiece, such as a wafer 104, is moved in a direction orthogonal to the ion beam width. In FIG. 2, the ion beam 114, after exiting a beam bending element 112 is moving in the z-direction, while the dosimetry control system 106 moves the workpiece 104 in the x-direction. If the ion beam intensity stays absolutely steady in time, moving a wafer at a constant velocity will perform uniform doping over the entire area of a wafer. However, ion beam intensity fluctuates for various reasons, for example, by attenuation and photoresist outgassing. In such instances, the wafer motion velocity has to be changed by the dosimetry control system 106 so that the doping density on the workpiece stays constant over time.

The ion beam 110 that appears to spread out at a point 108, either as a steady state DC beam (broad beam) or with an aide of a fast electrostatic or electromagnetic deflection system, enters a beam bending element 112, such as a magnetic lens that is sometimes called an angle corrector magnet. Alternatively, the beam bending element 112 may be called an angular energy filter (AEF). The beam bending element 112 converts the fanning out beam from the point 108 to a parallel wide beam in a similar fashion as an optical lens system in which an object is placed at the front focal length of the lens. The width of the parallel ion beam (the width extending in the y-direction) is orthogonal to the direction of the mechanical motion of the workpiece (the x-direction). The angle of fanning out at the point 108 is adjusted so that the emerging parallelized beam out of the beam bending element 112 has sufficient width to cover the entire width or diameter of the workpiece in the process chamber 102. In one embodiment, the beam bending element 112 (e.g., the angle corrector magnet) is housed in a separate vacuum chamber 116 with its own vacuum pump 118 and is connected to the process chamber 102 through a narrow canal of a conductance limiter 118 that in one embodiment is barely wide enough for the entire parallelized ion beam to go through.

At the exit 120 of the beam bending element 112, two narrow Faraday cups 122 are placed on both sides of the wide ion beam 110 to monitor and sample a portion of the ion beam current. In one embodiment, in front of each narrow Faraday cup 122 is a one or more narrow apertures or slits 124 that are configured to restrict the acceptance angle of ion beam to the cup, as will be described in greater detail below.

In one embodiment, the observed ion beam currents at the two Faraday cups are added together and the sum of the currents is fed to the dosimetry control system 106. In one embodiment, the control system 106 averages together the multiple beam current readings and uses the average beam current to control a the mechanical motion or scanning of the workpiece in the x-direction, which is orthogonal to the width of the ion beam that extends in the y-direction.

Figure 3:
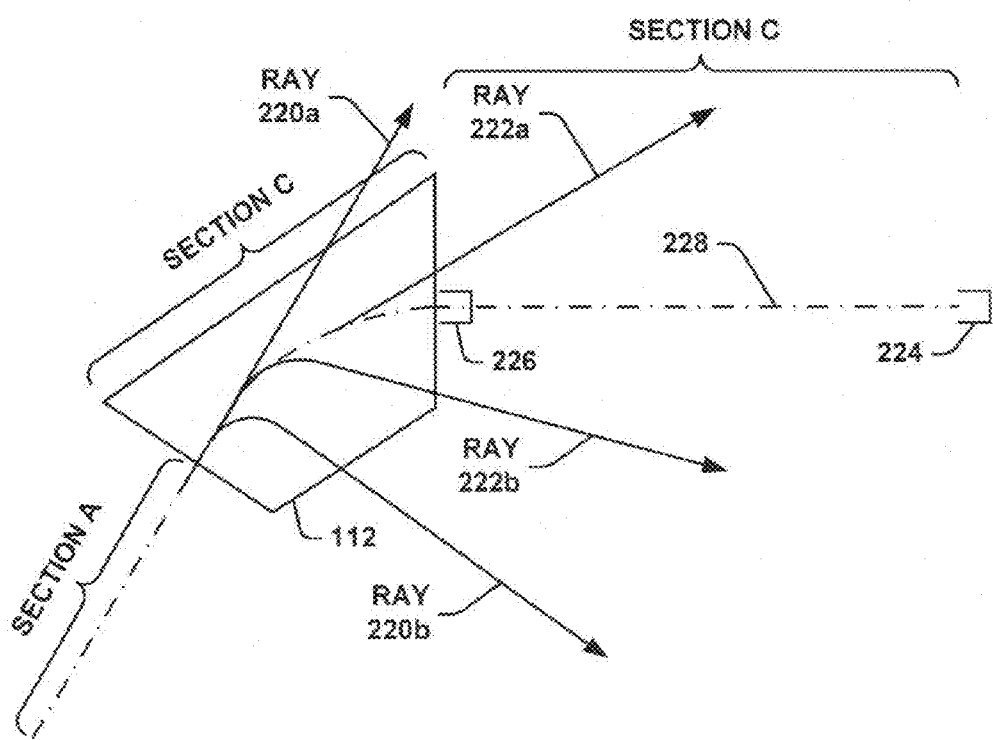
FIG. 3 is a ray diagram illustrating various aspects and advantages of the present invention.

FIG. 3 is a simplified diagram to show the advantage behind the placement of the two Faraday cups at the immediate exit of the beam bending element (i.e., angle corrector) in this invention. For clarity and purposes of illustration, the ion beam is assumed to stay narrow throughout the beam line. The beam line is divided into 3 sections: Section A is the part before the beam bending element 112, Section B is the part within the beam bending element, and Section C is the last straight section between the beam bending element and the workpiece. Two imaginary faradays are placed, one a wafer or workpiece location 224, and the other 226 at the exit opening of the beam bending element as in the present invention. In a good vacuum in which the occurrence of charge exchange reactions is negligible, the actual number of particles arriving at the Faraday 224 (which represents the workpiece location) is same as the electrical beam current measured by either Faraday 224 or 226 which is at the exit opening of the beam bending element 112. When the vacuum level worsens in the entire sections (Sections A, B and C) and charge exchange reactions start occurring, the electrical current starts deviating from actual number of particles arriving at the Faraday 224.

Ions traveling through a magnetic field are bent on a plane perpendicular to the direction of the magnetic field by the well known Lorentz force, $F=qv \times B$. The degree of bending, or radius of the curvature R, is given as; $R=k*\sqrt{mass*energy}/q/B$, where mass, energy and q are the mass, energy and charge value of the ion and B is the field strength of the magnetic field. In FIG. 3, the magnetic field is adjusted so that the original (non-charge exchanged) ions are bent to emerge straight out into the direction of the Faraday 224 at 228. When some ions change their charge states in Section A because of the charge exchange reactions, they experience different bending in the magnetic field as depicted as 220a and 220b, and will not reach the wafer at the Faraday location 224. The same situation happens for ions which change their charge state in the Section B as depicted as 222a and 222b and they most likely miss the wafer at the Faraday location 224. In short, because of the different degrees of bending in the magnet 112, all the charge exchanged ions in Sections A and B are likely to miss the wafer at the Faraday location 224.

The situation is quite different for charge exchanged ions in Section C between the exit opening of the beam bending element 112 and the Faraday 224. All the charge exchanged ions in the Section C will go into the Faraday 224, that is, the number of particles arriving at the Faraday 224 is not affected by the charge exchange reactions in Section C and if a wafer is placed at the Faraday location 224 the ions having experienced charge exchange reactions will contribute to the implantation. This is because charge exchange reactions do not affect ion beam direction significantly in Section C with no appreciable magnetic field being present thereat. However, an electrical current at the Faraday 224 is affected by the presence of charge exchanged ions in Section C and for the relationship between the number of ions and electrical current, one has to use qav instead of a single value q and the straight relationship between them collapses.

Still referring to FIG. 3, the electrical beam current recorded at the Faraday 226 at the exit opening of the beam bending element 112 will be evaluated. The Faraday 226, in one embodiment, has one or more narrow slits associated therewith to limit acceptance of only ions on or in close proximity to the Faraday axis. That is, only ions that are within a predetermined angle range about the axis of the Faraday 226 will be accepted. Ions reaching the Faraday 226 have to have the desired charge value (e.g., a single charge value) since all the ions with wrong charge values due to charge exchange reactions have different trajectories like 220a, 220b, 222a, and 222b and are not on the axis of the Faraday 226. Therefore at the Faraday 226, the straightforward relationship of the formula described supra between the number of particles and the electrical beam current, holds there. Also, all the ions measured at the Faraday 226 are on the straight axis 228, and those ions will travel straight to a wafer at the Faraday 224 location when the Faraday 226 is retracted. Therefore the beam current measured by the Faraday 226 is an excellent measure of the number of particles reaching a wafer even when there are large numbers of charge exchange reactions.

Referring back to FIG. 2, the ion beam has a broad beam width (i.e., a ribbon shaped beam) at the exit opening of the beam bending element 112. Instead of the Faraday 226 FIG. 3, two faradays 122 with a narrow acceptance angle sample a portion of the ion beam at both edges thereof. Having two faradays, one on each side of the wide ribbon shaped beam has a definite advantage. When a vacuum level degrades, the actual number of particles reaching an outside part of the wafer and the inside part of the wafer start deviating from each other because of the difference in the beam path lengths in Sections A and B. Consequently, one outer edge of the workpiece receives less particles because of the longer path of the outer trajectory. A faraday at the outer edge of the beam at the exit of the corrector sees less beam than a faraday at the inner edge of beam for the same reason. If we represent a beam by the outer faraday alone, we would underestimate the actual number of particles reaching the rest of the wafer toward the inner side. The situation will be opposite if we use only the faraday at the inner edge alone. By using an average of the two faraday signals, we can represent the actual number of particles reaching the middle of wafer and the error over the entire wafer area can be halved.

A large quantity of outgassing arises when a high speed ion beam strikes an organic film such as a photoresist on a wafer which is housed in the process chamber 102 in FIG. 2. As described above, all the charge exchange reactions in Section C, the last straight section between the exit opening of the beam bending element 112 and the workpiece 104, does not affect the number of particles to reach the wafer 104, and as long as a dosimetry system maintains integrity, it is not harmful to have some increased pressure (i.e., a degraded vacuum) in Section C. Bad effects of photoresist outgassing, however, cause a pressure rise in Sections A and B, since it actually alters the number of particles to reach the workpiece or wafer. Therefore one embodiment of the present invention reduces vacuum pressure degradation in Sections A and B. In this embodiment, a long narrow conductance limiter 118 connects the magnet chamber 116 and the process chamber 102 to reduce an influx of outgas into Section A and B, and separate high vacuum pump(s) 118 are installed on or in the magnet chamber 116 to maintain the best vacuum during the photoresist outgassing that occurs during implantation.

Still referring to FIG. 2, in front of the Faradays 122 are a series of one or more slits 124 designed to limit angle acceptance so that they measure only ions which would reach the wafer even if they change charge state afterward. The faradays optimally should not register ions which have a high angle with respect to the faraday axis and that would miss the wafer like the ray 222b shown in FIG. 3. The angle collimation to the faradays can also be enhanced electronically according to one embodiment for a system in which the wide ribbon shaped beam is created by scanning a narrow beam at the point 108. Assuming the beam is deflected left and right at point 108 by a triangle waveform like the one shown in FIG. 4, the waveform can be seen as a deflection angle versus time, or beam position on the wafer 104 over time. FIG. 5 shows a corresponding beam current signal at the inner faraday 122. The faraday 122 registers only when the beam sweeps across the narrow slit of the faraday and the timing of the pulses are related to the instantaneous position of the beam and the position of the faraday cup.

Figure 4:
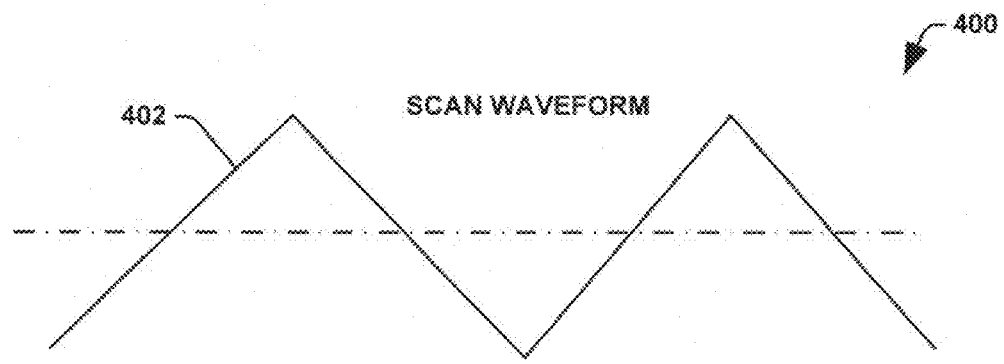
FIGS. 4-6 illustrate plots with respect to electronic gating according to one or more aspects of the present invention.
Figure 5:
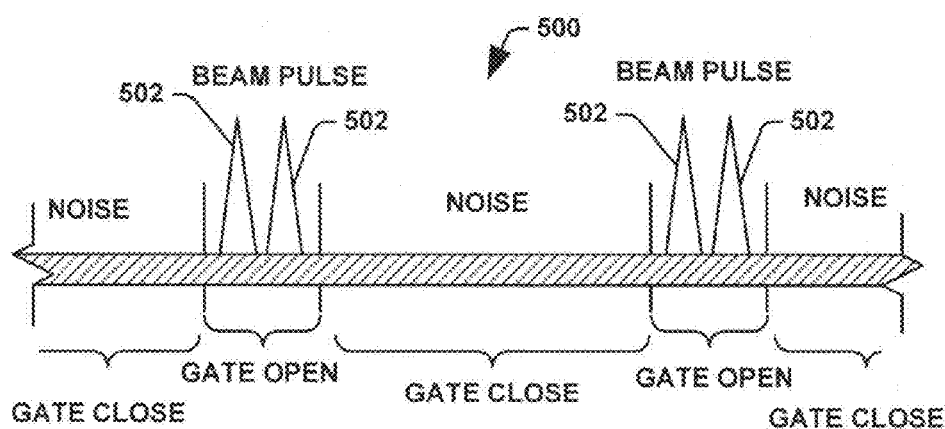

The ion beam moves back and forth with the waveform 402 in FIG. 4 and a typical exaggerated signal 500 from the Faraday cup (e.g., Faraday cup 122 in FIG. 2) shown in FIG. 5. The location (i.e., phase) of the beam pulses 502 observed on the Faraday with respect to the scan waveform, one from the "up" sweep and one from the "down" sweep. Since the Faraday cup 122 is located near the edge of the magnet, but slightly inside of the scan width, the pulses 502 appear near the peak of the waveform and the two pulses appear very close together. For dosimetry measurements, only the beam current (i.e., charge) contained in the beam pulses is employed, and any signal between the pulses is treated as noise for the purpose of dosimetry and can be quite harmful in measuring low current.

Included in the noise (non-synchronized to beam scan) may be leakage current from a Faraday cup, leakage and random noise generated in I/V and some induction noise from a commercial frequency (ham) or periodic spikes from a motor or PWM power supplies. Also the noise (synchronized to beam scan) can be from the actual beam, but scattered or a product of charge exchange reaction from another trajectory, like the stray beam 222b shown in FIG. 3.

Figure 6:
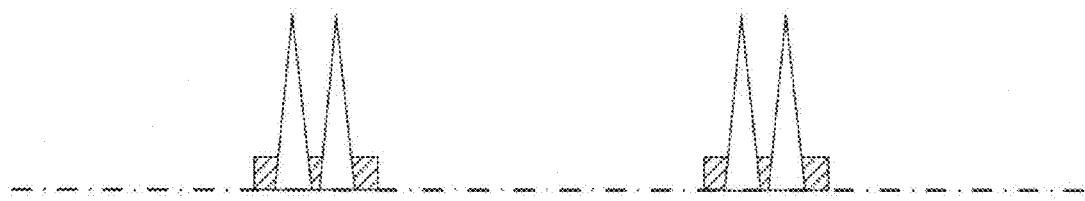

The charge exchanged beam, for example, ray 222b in FIG. 3 would show up or be a part of the measured beam current, if it happens to enter in the faraday, at a different location than that of the main peaks, since it comes from a different phase of the scanning. Therefore such stray beams constitute noise that is diagrammatically shown in FIG. 5. Rejection of charge exchanged ions like ray 22b is primarily done according to the present invention with a mechanical slit system 124, but, using the fact that the signal from charge exchanged ions appears in a difference phase of scanning, we can reject them further by applying an electronic gate to the signal to cut off all the signal of Faraday 122 except for a narrow region around the main peaks as shown in FIG. 6. This can be done by electronic gating synchronized to beam scan timing.

For example, if the raw signal (can be output of I/V) is passed through an electronic gate which opens for a short time interval, synchronized to beam scan, we can cut out most of the two types of noises listed above, as shown in the bottom line of FIG. 6, of the waveform diagram. This electronic gating can be extended to more and wider applications, where ever the cup signal consists of pulses synchronized with the scanned waveform. It can also be used simply as noise suppression, whenever beam pulse tends to be buried among random or DC noise, typically encountered measuring the low end of the beam current range. It can also be used as an electronic beam collimator to reject "off angle" beams which come from neighboring trajectories involving different phases of the beam scan.

Figure 7:
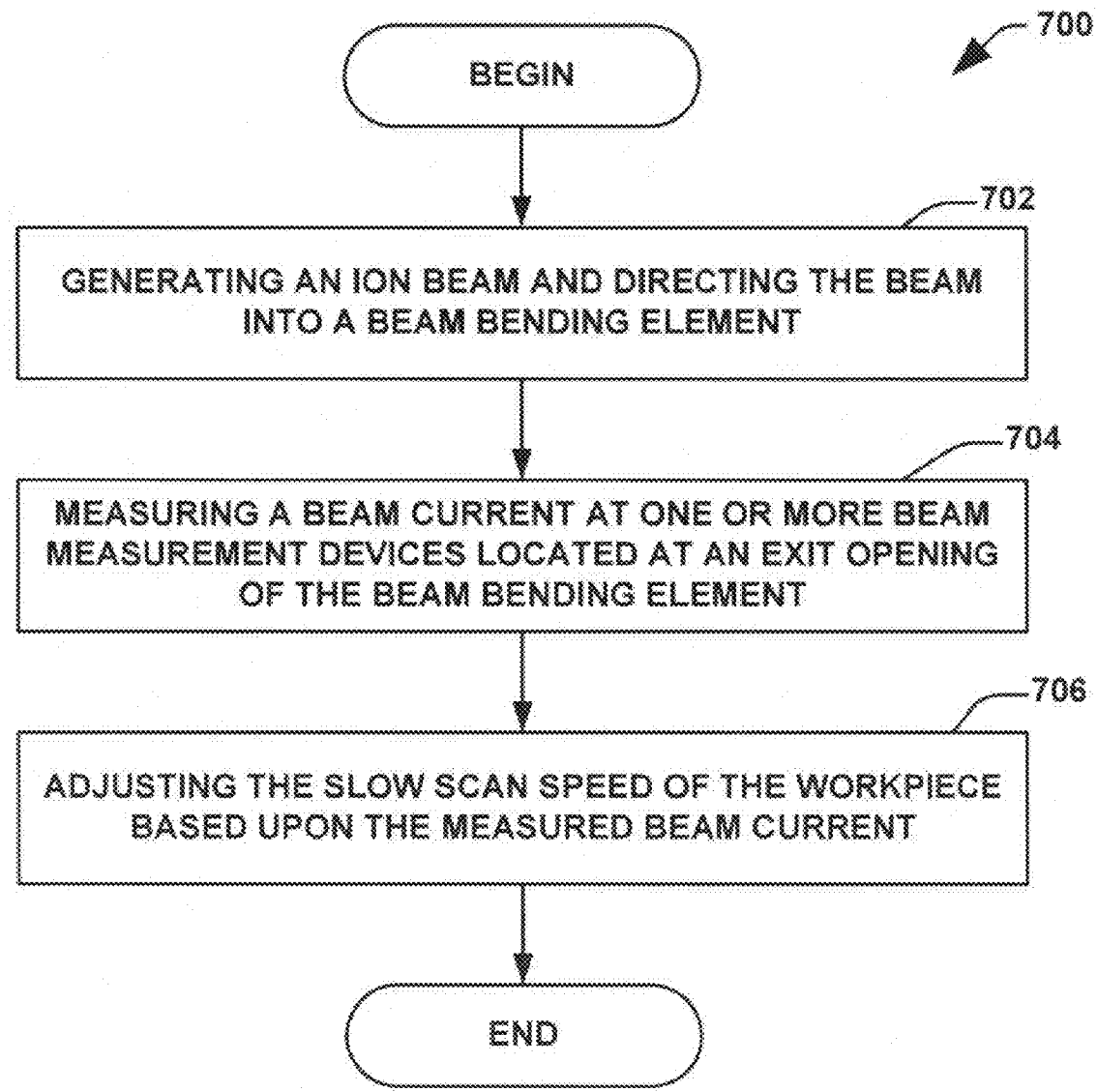
FIG. 7 is a flow chart diagram illustrating a method performing dosimetry control according to yet another embodiment of the present invention.

Referring now to FIG. 7 it should also be noted that while an exemplary method 700 is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the system 300 illustrated and described herein as well as in association with other systems not illustrated.

The method 700 begins at 702 wherein an ion source generates an ion beam and directs the beam into a mass analyzer. The magnetic field strength for the mass analyzer can be selected according to a charge-to-mass ratio. The mass analyzer, if employed, can be configured downstream of the ion source.

Downstream of the mass analyzer and prior to striking the workpiece, the ion beam may be scanned from a pencil shaped beam to a ribbon-shaped ion beam, and the is subject to another beam bending element, such as an angle corrector magnet or an angular energy filter (AEF). At 704, an ion beam current is measured at one or more faraday cups that are located at an exit opening of the beam bending element. (See e.g., FIG. 2). It should be appreciated that in one embodiment the current can be an average of the Faraday cup readings or may be a single reading from a single beam current measuring device.

At 706 the slow scan speed of the workpiece with respect to the ion beam is controlled based on the ion beam current reading to maximize dose uniformity at the workpiece.

In addition, the faraday cups in the method 700 may employ the one or more slits to limit the acceptance of stray ion beams to further improve the ion beam measurements. Still further, in another embodiment an electronic gate may be employed in conjunction with the faraday cups (or other beam current measurement device(s)) to selectively block beam current readings based on a scan voltage of an upstream scanner. In this manner, the faraday cups only record a beam current when the scanned beam is passing by the cup, thereby reducing noise and further improving ion beam current accuracy.

Although the invention has been shown and described with respect to a certain applications and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. An ion implantation system, comprising:
   an ion source configured to generate an ion beam;
   a mass analyzer configured to mass analyze the ion beam;
   a scanner configured to scan the mass analyzed ion beam to form a ribbon-shaped ion beam;
   a bending element downstream of the scanner and configured to bend the ribbon-shaped ion beam;
   an endstation configured to secure a workpiece and receive the bent ribbon-shaped ion beam; and
   a beam current measuring system immediately following the bending element, and configured to measure an ion beam current associated with the bent ribbon-shaped beam immediately following the bending element; wherein the beam current measuring system comprises a first Faraday cup located at a first lateral edge of the ribbon-shaped ion beam at an exit of the bending element; and wherein the beam current measuring system further comprises a second Faraday cup located at a second lateral edge of the ribbon-shaped ion beam opposite the first lateral edge, and located at the exit of the bending element.

2. The ion implantation system of claim 1, further comprising a controller configured to receive the measured ion beam current and control a slow scan speed of the endstation in response thereto.

3. The ion implantation system of claim 2, wherein the controller comprises an electronic gate configured to selectively block the ion beam current measurement at the beam current measuring system.

4. The ion implantation system of claim 3, wherein the controller is configured to synchronize the selective blocking of the ion beam current measurement with a scanning of the scanner to block the ion beam current measurement at the beam current measuring system at time periods when the scanned ion beam is not present at the beam current measuring system.

5. The ion implantation system of claim 1, further comprising a controller configured to receive a first ion beam current measurement from the first Faraday cup, a second ion beam current measurement from the second Faraday cup, calculated an average ion beam current from the first and second ion beam current measurements, and control the slow scan speed of the endstation in response to the average ion beam current.

6. The ion implantation system of claim 1, wherein the first Faraday cup comprises a slit configured to limit an angle of acceptance of ions therein, wherein only ions of the ribbon-shaped ion beam having an angle of incidence less than an predetermined threshold with respect to a first Faraday cup axis are included in the ion beam current measurement.

7. The ion implantation system of claim 6, wherein the predetermined threshold is set at a value so that ions having an angle of incidence greater than or equal to the predetermined threshold would not reach the workpiece secured at the endstation.

8. The ion implantation system of claim 1, wherein the beam current measuring system is closer to the bending element than to the endstation.

9. The ion implantation system of claim 1, wherein the beam current measuring system is located at an exit opening of the bending element.

10. A method of performing dosimetry control in an ion implantation system, comprising:
    generating an ion beam;
    mass analyzing the ion beam;
    scanning the mass analyzed ion beam to form a ribbon-shaped ion beam;
    bending the ribbon-shaped ion beam using a beam bending element;
    measuring a beam current of the ribbon shaped ion beam at an exit opening of the beam bending element; and
    directing the bent ribbon-shaped ion beam to a workpiece that is secured on an endstation; wherein measuring the beam current comprises positioning a first Faraday cup at the exit opening of the beam bending element corresponding to a first lateral edge of the ribbon-shaped ion beam and measuring a first beam current thereat; and wherein measuring the beam current further comprises positioning a second Faraday cup at the exit opening of the beam bending element corresponding to a second lateral edge of the ribbon-shaped ion beam opposite the first lateral edge, and measuring a second beam current thereat.

11. The method of claim 10, further comprising controlling the endstation with respect to the ribbon-shaped ion beam as a function of the measured beam current.

12. The method of claim 10, further comprising:
    averaging the first and second beam currents to form an average beam current value; and controlling the endstation with respect to the ribbon-shaped ion beam as a function of the averaged beam current value.

13. The method of claim 12, wherein controlling the endstation comprises controlling a slow scan speed of the endstation that secures the workpiece.

14. The method of claim 10, further comprising limiting an acceptance of ions of the ribbon shaped ion beam received by the first Faraday cup to a predetermined angle about an axis of the first Faraday cup.

15. The method of claim 10, further comprising:
selectively preventing the first Faraday cup from registering a beam current measurement as a function of the scanning of the ion beam into the ribbon-shaped ion beam.

16. The method of claim 15, wherein selectively preventing comprises allowing the first Faraday cup to register the beam current when the scanned ion beam sweeps across the first Faraday cup, and preventing the first Faraday cup from registering the beam current otherwise.

* * * * *